(12) United States Patent
Mnich (10) Patent No.: US 7,889,831 B2
(45) Date of Patent: Feb. 15, 2011

(54) N-BIT SHIFT REGISTER CONTROLLER

(75) Inventor: Christopher M. Mnich, Colorado Springs, CO (US)

(73) Assignee: ProMOS Technologies Pte. Ltd., Singapore (SG)

( * ) Notice: Subject to any disclaimer, the term of this patent is extended or adjusted under 35 U.S.C. 154(b) by 527 days.

(21) Appl. No.: 11/955,352

(22) Filed: Dec. 12, 2007

(65) Prior Publication Data

US 2009/0154286 A1    Jun. 18, 2009

(51) Int. Cl.
*G11C 19/00* (2006.01)

(52) U.S. Cl. .............................. 377/54; 377/66; 377/67

(58) Field of Classification Search .................... None
See application file for complete search history.

(56) References Cited

U.S. PATENT DOCUMENTS 4,380,736 A * 4/1983 Pfaff .......................... 327/160
4,916,403 A * 4/1990 Sudoh et al. ................ 327/159
2009/0285352 A1* 11/2009 Schmitt ....................... 377/54

* cited by examiner

*Primary Examiner*—Tuan Lam
(74) *Attorney, Agent, or Firm*—Peter J. Meza; William J. Kubida; Hogan Lovells US LLP (57) ABSTRACT

A column repair circuit uses a system of circuits that automatically stops the shifting of register contents independently of the number of bits to be shifted. The circuit is only dependent on the number of bits in a column address repair block. By adding shift register positions to one end of each shift register chain, a dedicated block of bits is used to detect the end of the shift chain without explicitly knowing the length of the chain. The shift register positions provide a hard-programmed code that can be used to stop the shifting of data automatically. The shift register positions also provide a space for hard-programmed code bits that can be examined to determine when the shift process ends. A shift chain can be controlled with a controller so long as the information is organized into groups of 'k' bits. The controller only requires information regarding the value of the number 'k' and the pre-programmed stop code in order to control any number of bits in a shift chain.

8 Claims, 15 Drawing Sheets

EACH PHYSICAL FUSE HAS A DEDICATED LATCH
TO HOLD THE LOGICAL VALUE OF THAT FUSE

N-BIT SHIFT REGISTER CONTROLLER

BACKGROUND OF THE INVENTION

The present invention is related to laser-based fuse layouts for semiconductor devices, and more particularly to a circuit and method for minimizing the area of such layouts for use in column address repair in integrated circuit memories.

In general, laser-based fuse layouts in semi-conductor devices are wasteful in terms of the area needed for the fuses. They often require large openings in which no other metal lines can run above or below the fuses. Additionally, no logic gates can be underneath the fuses either. These rules make it difficult to provide both data output logic and column address repair (in a DRAM column circuit) without impacting the area of the chip.

Previous fuse circuit solutions used a fuse load shift register in series with a fuse store shift register. The shifting stops when a counter circuit has counted up to the number of fuses (wherein "n" is used to reference the number of fuses).

While this prior art scheme is simple, it has some major disadvantages. The counter must count exactly the number of fuses that need to be shifted. This means that the number of counter bits required is determined by the following equation:

$$m = \frac{\ln(n)}{\ln(2)}$$

Where n is the number of fuses and m is the number of counter bits. Counters are easiest to deal with when "n" is a power of two and can be rather difficult to implement for when "n" is not a power of two. It becomes difficult for designers to continually change the programming of the counter due to changing column address fields and/or changing the number of column repair fuses.

Figure 1:
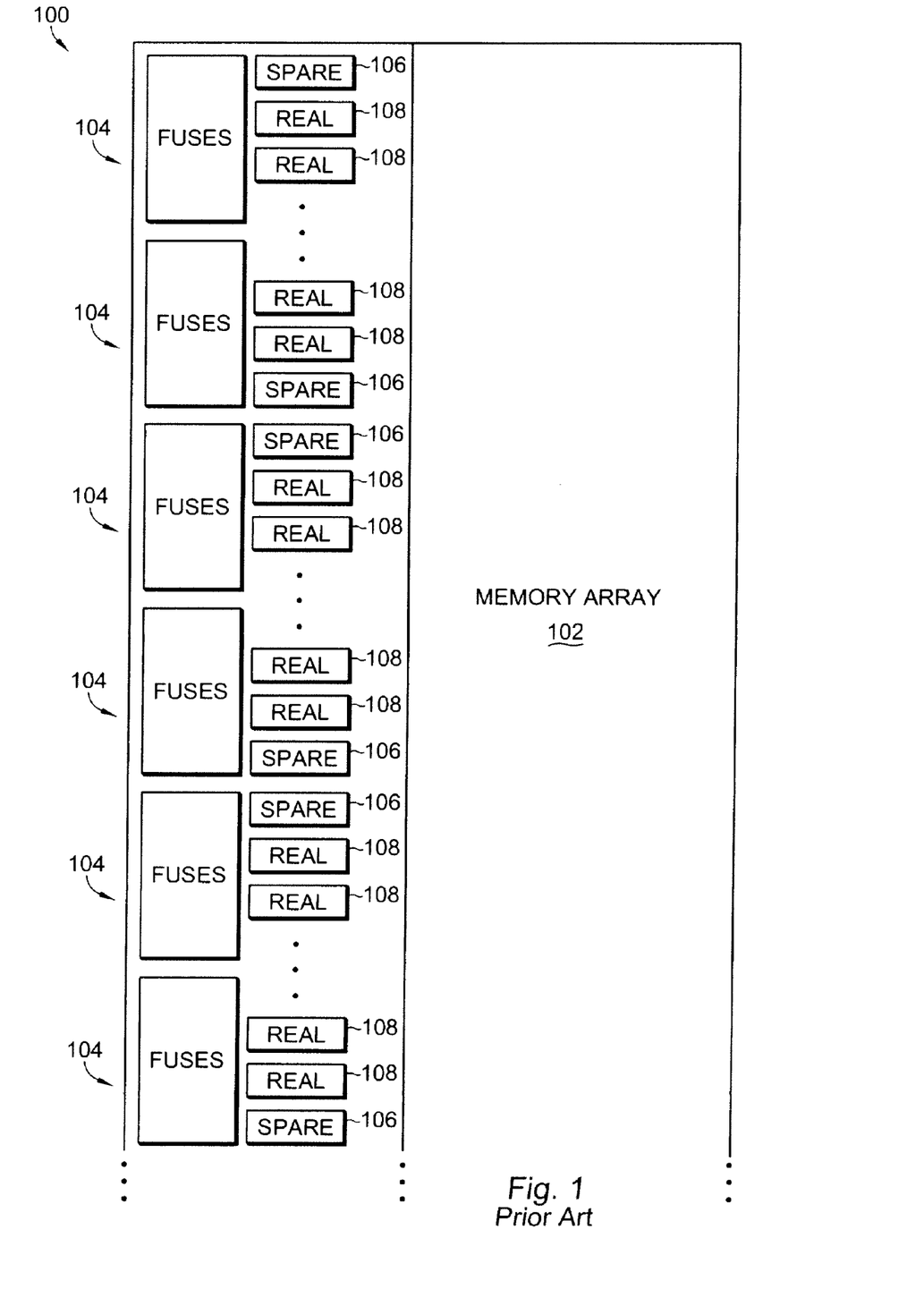
FIG. 1 is a block diagram of a portion of an integrated circuit memory including a column decoder block and repair circuit according to the prior art.

Referring now to FIG. 1, a portion 100 of a prior art integrated circuit memory is shown having a typical column address repair circuit. The portion 100 of the integrated circuit memory includes a memory array 102, a column decoder block including a plurality of fuses 104, a plurality of "real" column address decoder circuits 108, and a plurality of "spare" column address decoder circuits 106. Note that in FIG. 1, the column repair fuses 104 are located inside the column decoder block itself.

Figure 2:
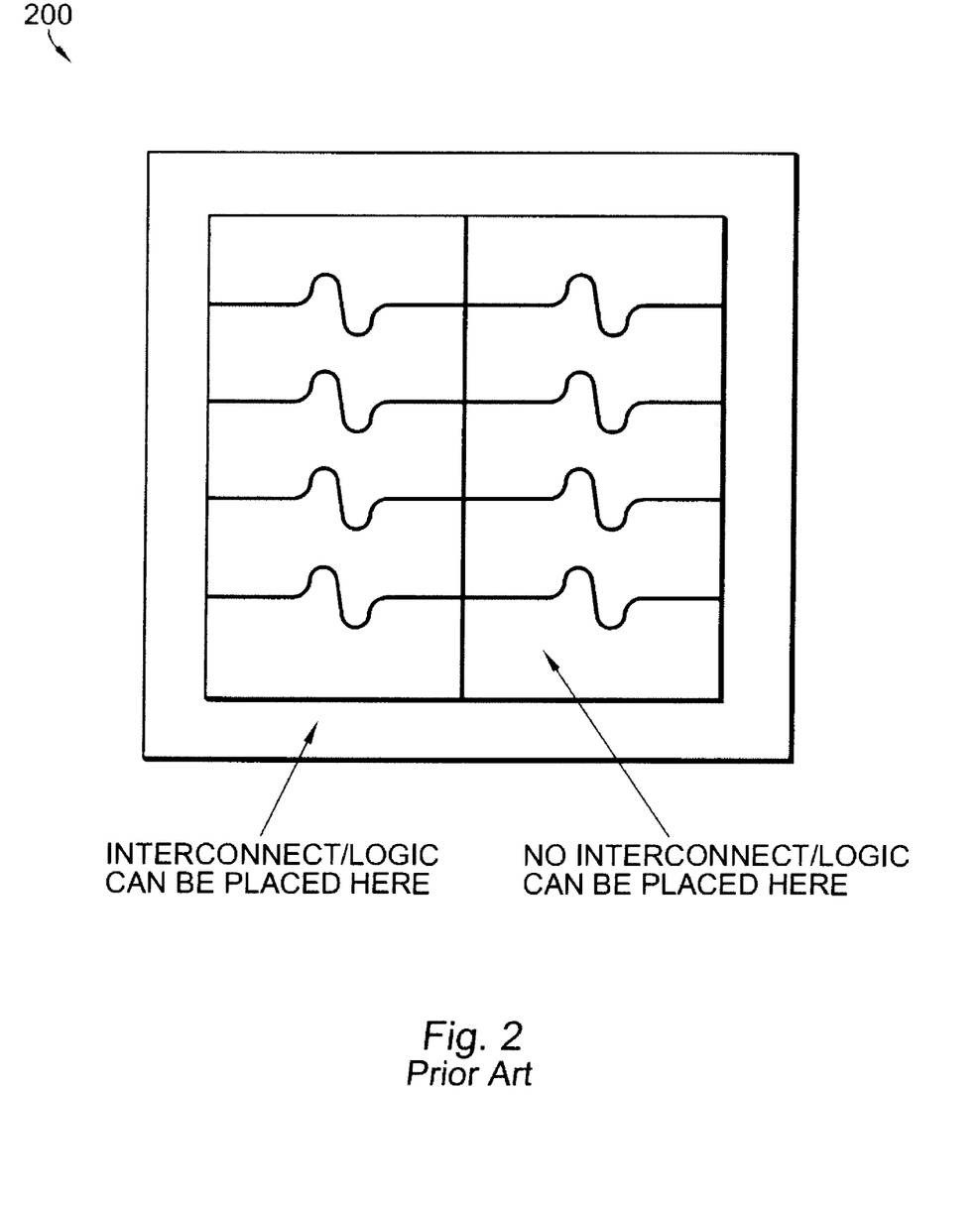
FIG. 2 is a column repair fuse block according to the prior art.

A prior art fuse block 200 is shown in greater detail in FIG. 2, wherein a plurality of fuses is shown having a plurality of first ends available for interrogation and a second common connection usually tied to ground or to a common reference voltage. The column repair fuse block 200 undesirably consumes a great deal of integrated circuit area because no interconnect metal or logic gates can be placed above or below the fuses themselves. Interconnect metal or logic gates can only be placed around the periphery of the fuse block, as is shown in FIG. 2.

Figure 3:
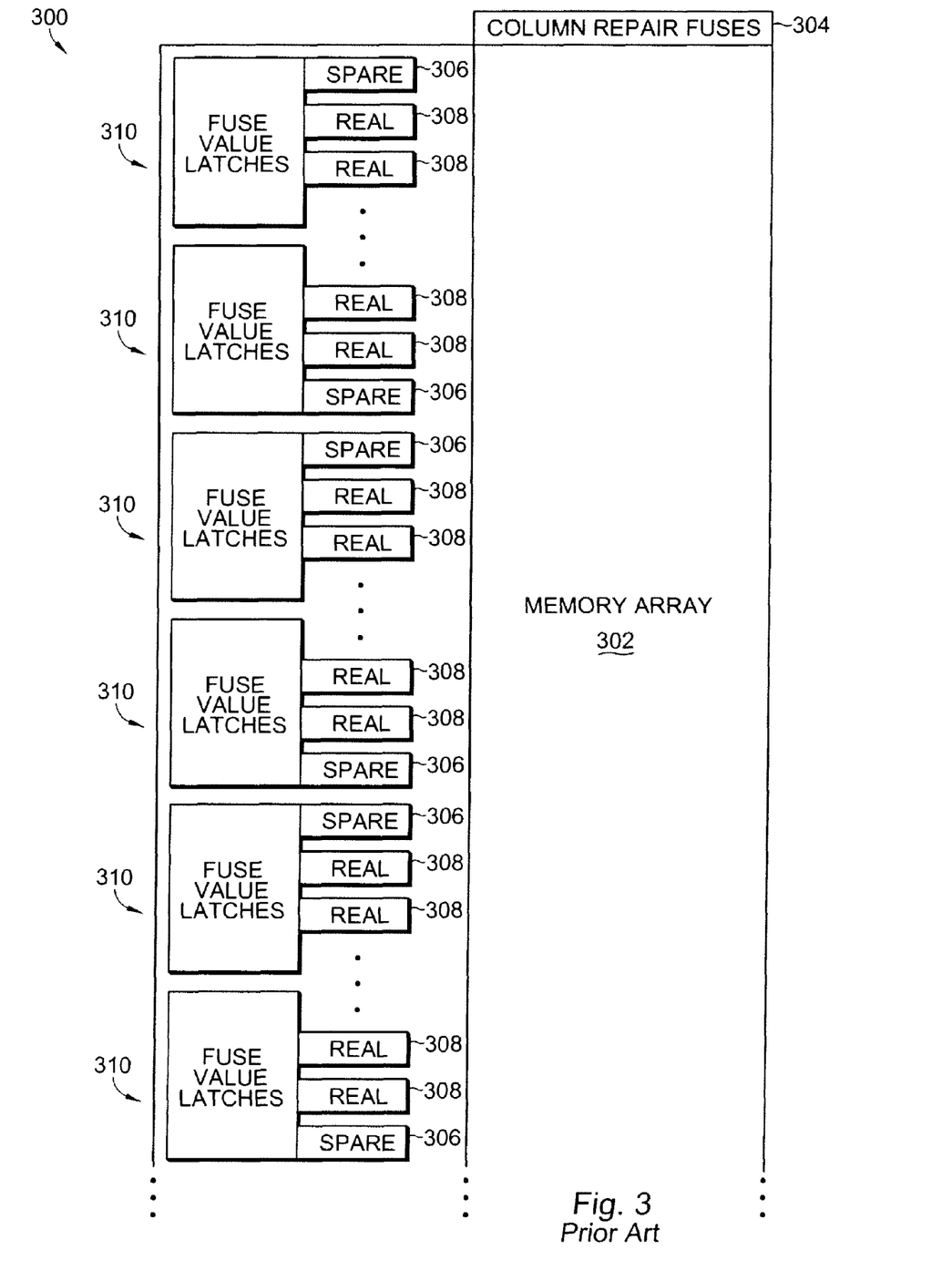
FIG. 3 is a block diagram of a portion of an integrated circuit memory including a column decoder block and latch-based repair circuit according to the prior art.

A variation of the standard column address repair circuit is shown in FIG. 3. In the integrated circuit memory portion 300 shown in FIG. 3, the actual column repair fuse block 304 is moved from the left side of the memory array 302 and moved to the "top" of the memory array 302. The spare 306 and real 308 column address circuitry remains along the left side of the memory array 302, similar to the circuit shown in FIG. 1. The column repair fuses 304 are replaced in their original location by a plurality of fuse value latches 310. In this way, the fuses can be placed anywhere within the integrated circuit memory and their information can be transferred to the plurality of fuse value latches 310. This affords greater flexibility in laying out the integrated circuit memory, as well as other advantages noted below.

Figure 4:
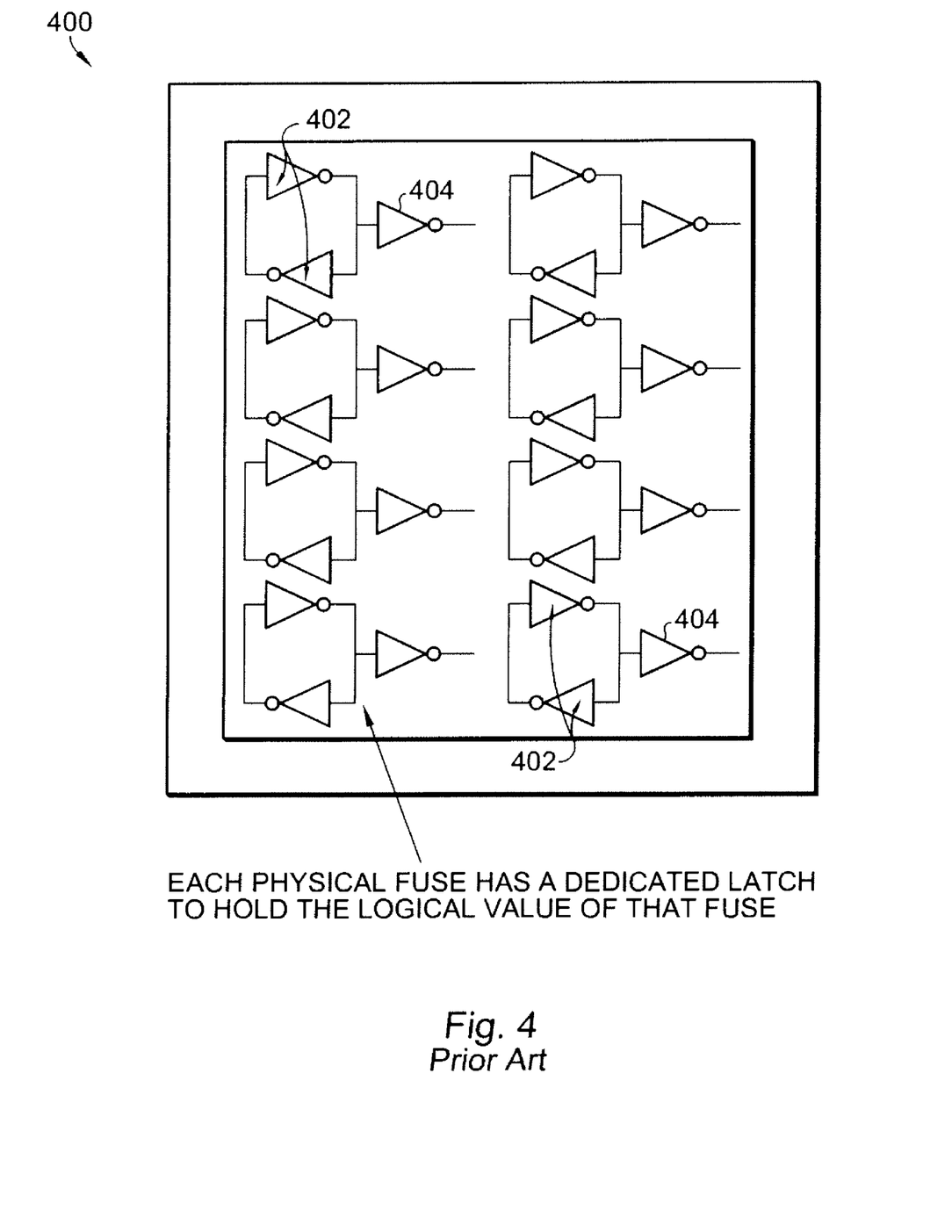
FIG. 4 is a column repair latch block according to the prior art.

A fuse value latch block 400 is shown in prior art FIG. 4. Fuse value latch block 400 includes individual latches 402 and an output inverter 404. In the fuse value latch block 400, interconnect metal can be placed on top of the block 400, and other logic gates can share any unused area within the block 400. Again, this is a design advantage over the circuit shown in FIG. 1.

Figure 5:
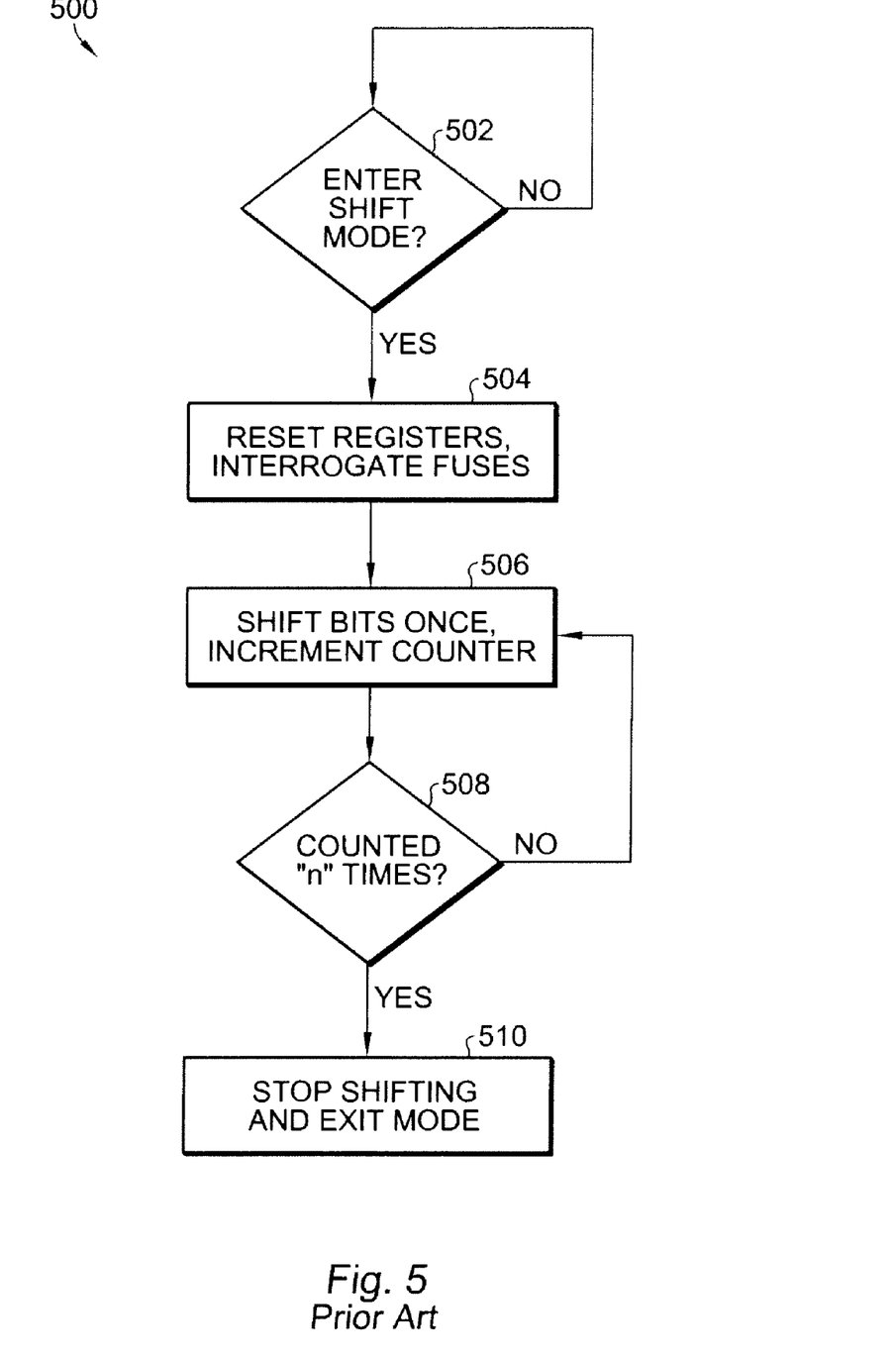
FIG. 5 is a state diagram of a counting method for a repair circuit according to the prior art.

The straightforward counting method and state diagram 500 thereof for the repair circuit of the prior art is shown in FIG. 5. At step 502, the counting method enters the shift mode. At step 504 all registers are reset and the fuses are interrogated. At step 506 the bits in the registers are shifted once, and a counter is incremented. At step 508, the counter is interrogated to determine if it has counted "n" times, wherein "n" is the total number of items to be shifted. In the state diagram 500 of FIG. 5, "n" can be any number, and the counter must count exactly to that number. At step 510, shifting stops and the shift mode is exited.

Figure 6:
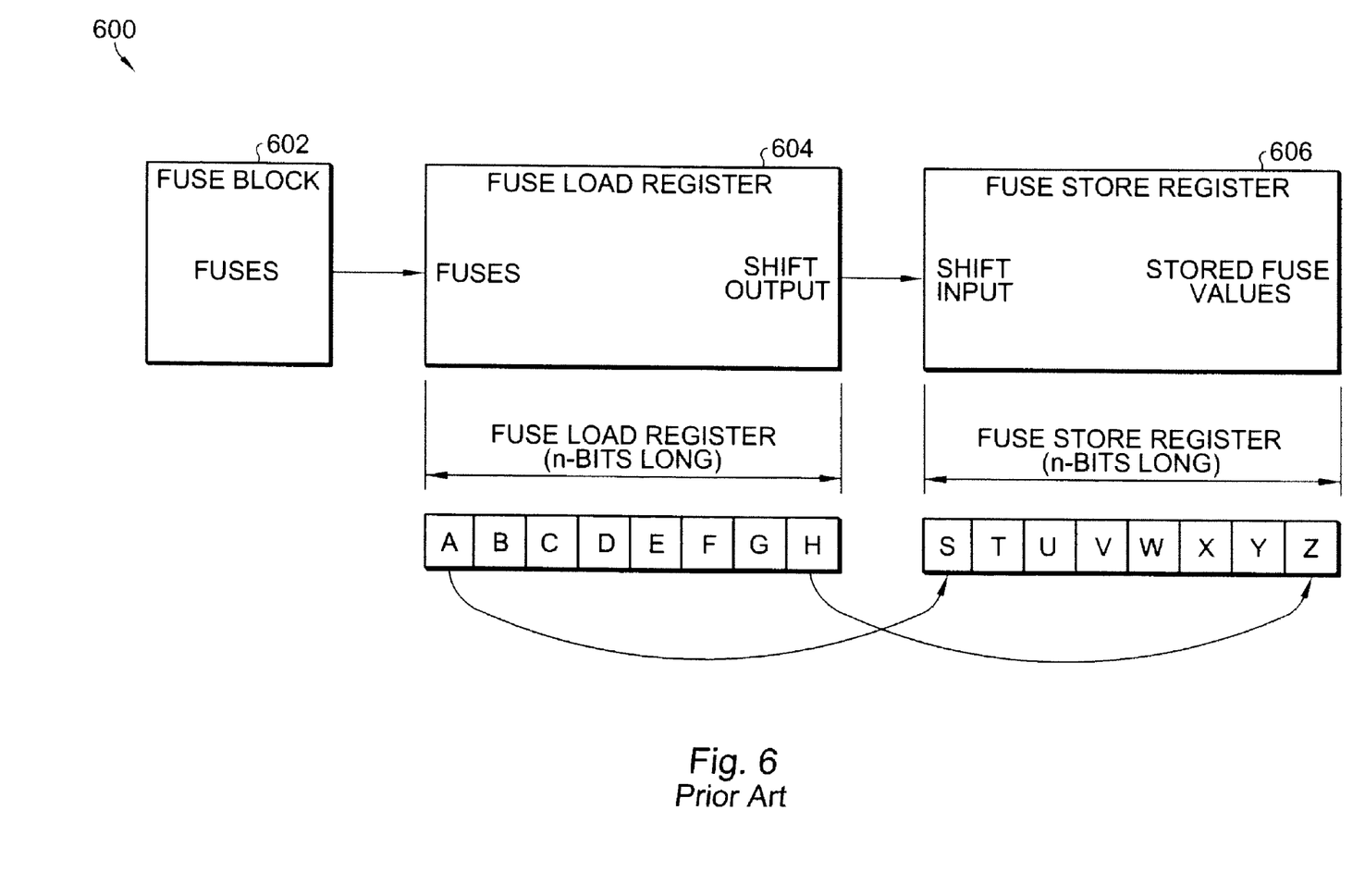
FIG. 6 is a simplified block diagram of a repair circuit according to the prior art.

A block diagram of a repair circuit 600 associated with the state diagram of FIG. 5 is shown in FIG. 6. The repair circuit 600 includes a fuse block 602, a fuse load register 604, and a fuse store register 606. The shift output of fuse load register 604 is coupled to the shift input of fuse store register 606. Referring to FIG. 6, it takes "n" shifts to move position "A" to position "S" and position "H" to position "Z". The straightforward counting method means that the counter has to count exactly to the number "n". Counting to any number other than "n" will result in the fuse values not being loaded into the proper position in store register 606.

Figure 7:
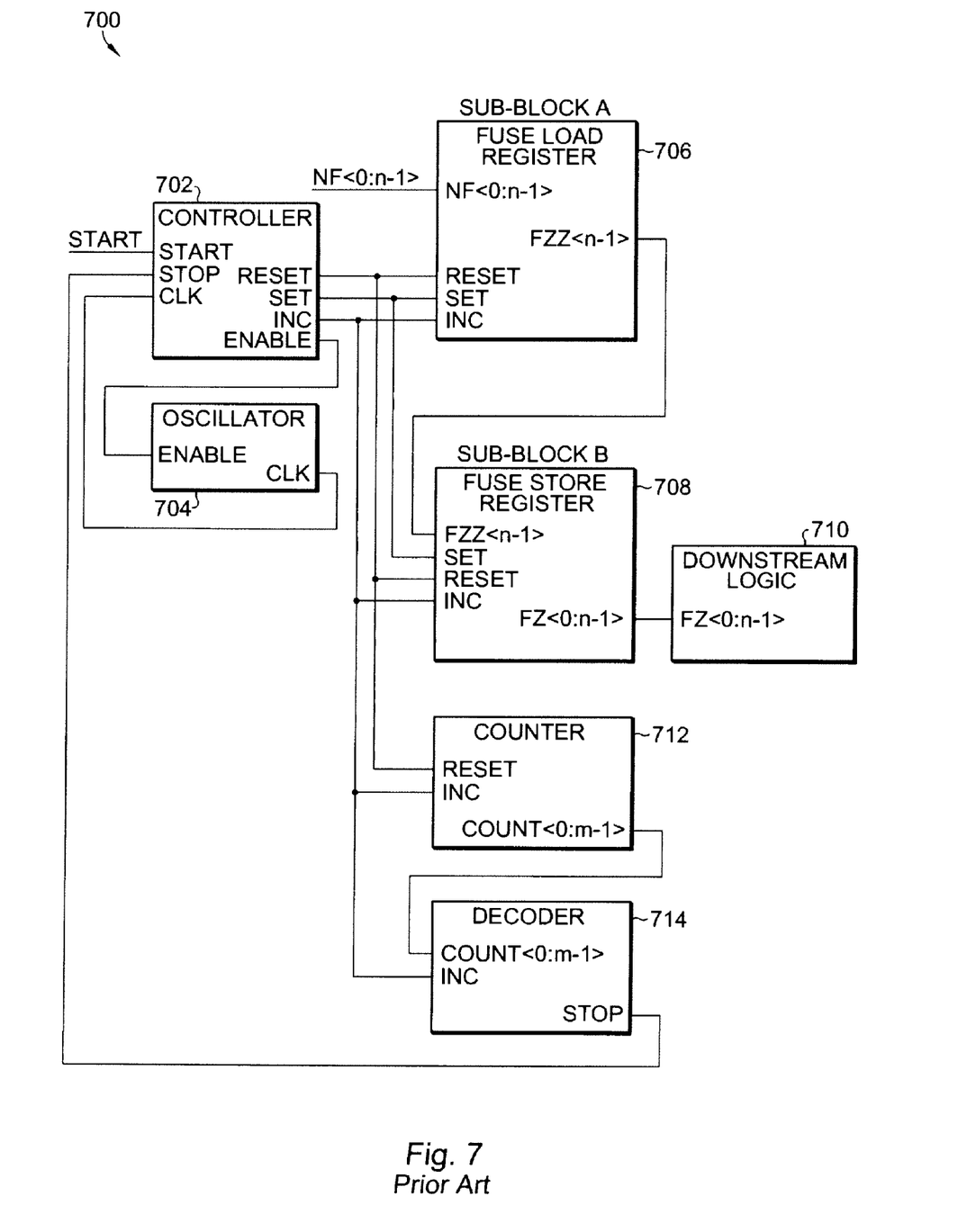
FIG. 7 is a detailed block diagram of a repair circuit according to the prior art.

A detailed block diagram of a prior art repair circuit 700 includes a controller 702, an oscillator 704, a fuse load register 706, a fuse store register 708, downstream logic 710, a counter 712, and a decoder 714. The only inputs to this system shown in FIG. 7 are START and NF<0:n−1>, the latter of which is the logical representation of the corresponding fuses. The NF<0:n−1> bits are shifted into the corresponding store registers, FZ<0:n−1>, respectively. This function is complete (meaning NF<0> has shifted all the way to position FZ<0>) when counter 712 as counted up to "n". Asserting START causes RESET to fire, followed by the firing of SET. Then shifting is enabled and occurs based on the signal INC.

Figure 8:
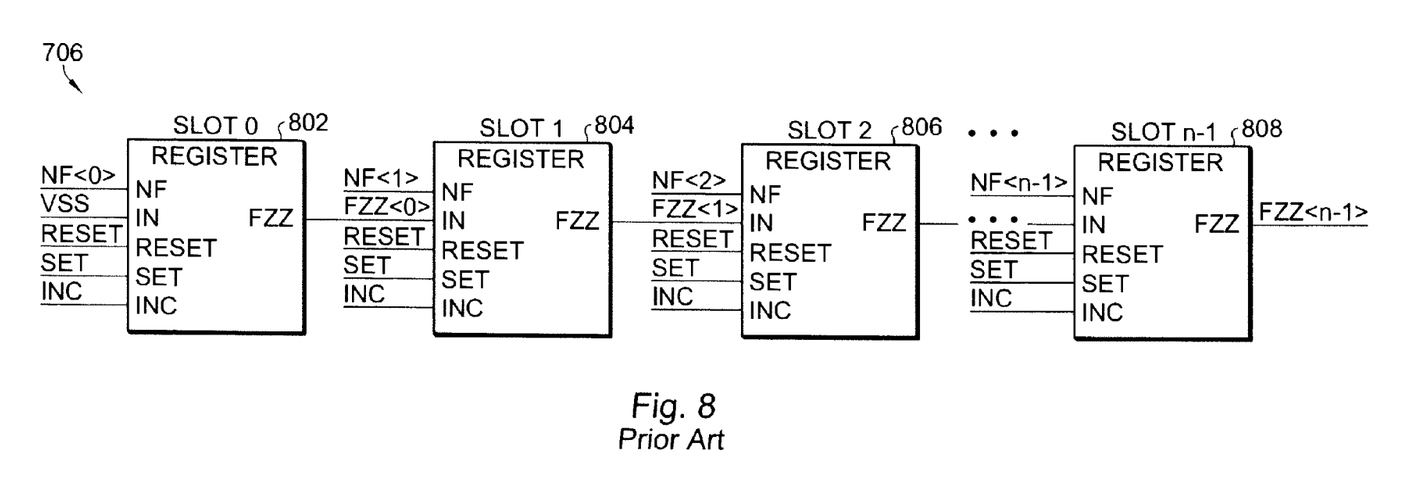
FIG. 8 is a sub-block diagram of a fuse load register from FIG. 7 according to the prior art.
Figure 9:
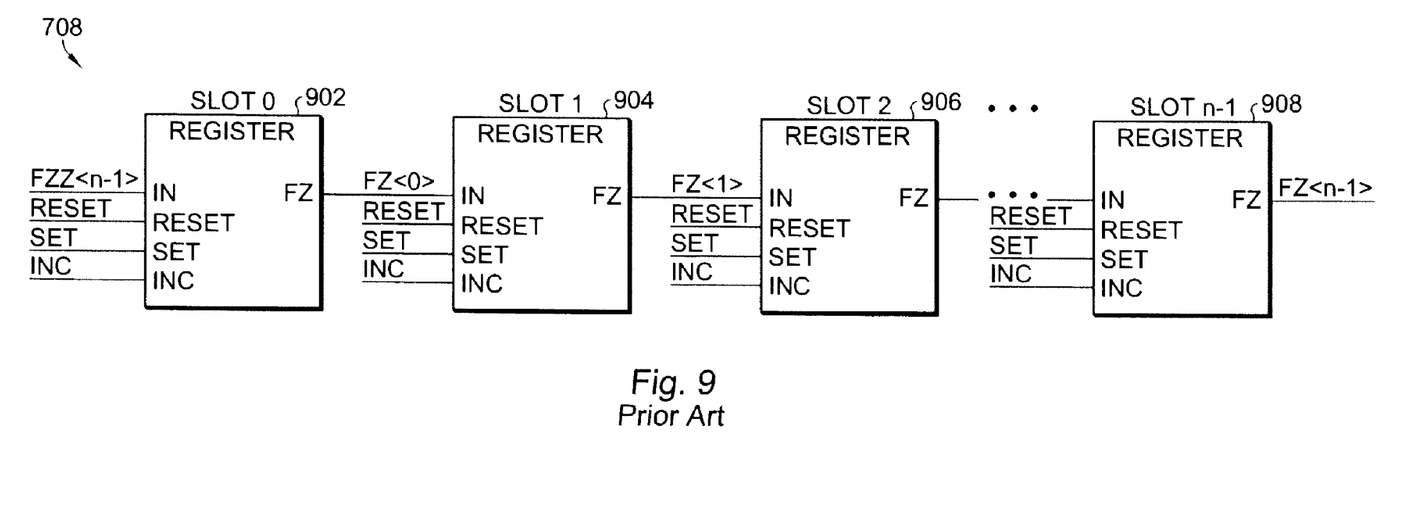
FIG. 9 is a sub-block diagram of a fuse store register from FIG. 7 according to the prior art.

Fuse load register 706 is shown in greater detail in FIG. 8, and includes coupled registers 802, 804, 806, and 808. NF<x> is the logical representation of the status of the corresponding physical fuse, where "x" is a value between 0 and n−1. Fuse store register 708 is shown in greater detail in FIG. 9, and includes coupled registers 902, 904, 906, and 908. Store register 708 does not have any physical fuses connecting to the registers. Nodes FZ<0:n−1> are sent to downstream logic 710 shown in FIG. 7.

What is desired is a fuse-based column address repair circuit for an integrated circuit memory free from the constraints of prior art circuits, including the requirement for counting to an arbitrary number of fuses that is not a power of two.

SUMMARY OF THE INVENTION

The design problem solved by the circuit and method of the present invention is summarized by the following design considerations. A shift register chain is designed that shifts column fuse information from outside the column area to inside the column area. The shift register chain is the same size or smaller than the area reserved for the column fuses (in the column area). The shifting in of the fuse information occurs each time a start signal is asserted. The shifting stops automatically when all the bits have been shifted in. The shift register uses an internally generated clock.

The column repair circuit and method of the present invention uses a system of circuits that automatically stops the shifting of register contents independently of the number of bits to be shifted (the variable "n"). The circuit and method of the present invention is only dependent on the number of bits in a column address repair block (which in a preferred embodiment is equal to eight bits). In the design of the present invention, the number of counter bits required is determined by the equation:

$$m = \frac{\ln(k)}{\ln(2)}$$

Where "m" is the number of counter bits and "k" is the number of bits in a column address repair block (again this is eight in a preferred embodiment).

The column address repair block bits are assigned thusly: 1=enable, 2-8=address. Without the bit (1) {enable} fuse blown, the other bits are ignored. For an un-blown fuse, its corresponding signal is a '0' while a blown fuse signal is a '1'. The typical code for a disabled address repair block is to have all fuse values of '0'. This is to prevent wasting time by blowing additional fuses. It is not necessary to blow address fuses 2-8 if the corresponding repair element (enable {bit 1}=0) is not going to be used. Since the addresses 2-8 are ignored if bit 1 is a '0', and the standard disable code is to have all bits equal to '0', any other code that is programmed into bits 2-8 while bit '1' is a '0' is a code that can be used for detecting a stop condition.

By adding (k) shift register positions to one end of each shift register chain, one can have a dedicated block of bits that can be used to detect the end of the shift chain without explicitly knowing (or needing to know) the length of the chain. The shift register positions serve two purposes. The first purpose is to provide a hard-programmed code that can be used to stop the shifting of data automatically. The second purpose is to provide a space for the hard-programmed code bits that can be examined to determine when the shift process must end. Using this method, a shift chain comprising nearly an infinite number of positions can be controlled with a simple, yet novel, controller so long as the information is organized into groups of 'k' bits. The controller of the present invention only requires information regarding the value of the number 'k' and the pre-programmed stop code in order to control any number of bits in a shift chain.

The foregoing and other objects, features and advantages of the invention will become more readily apparent from the following detailed description of a preferred embodiment of the invention, which proceeds with reference to the accompanying drawings.

DETAILED DESCRIPTION

Figure 10:
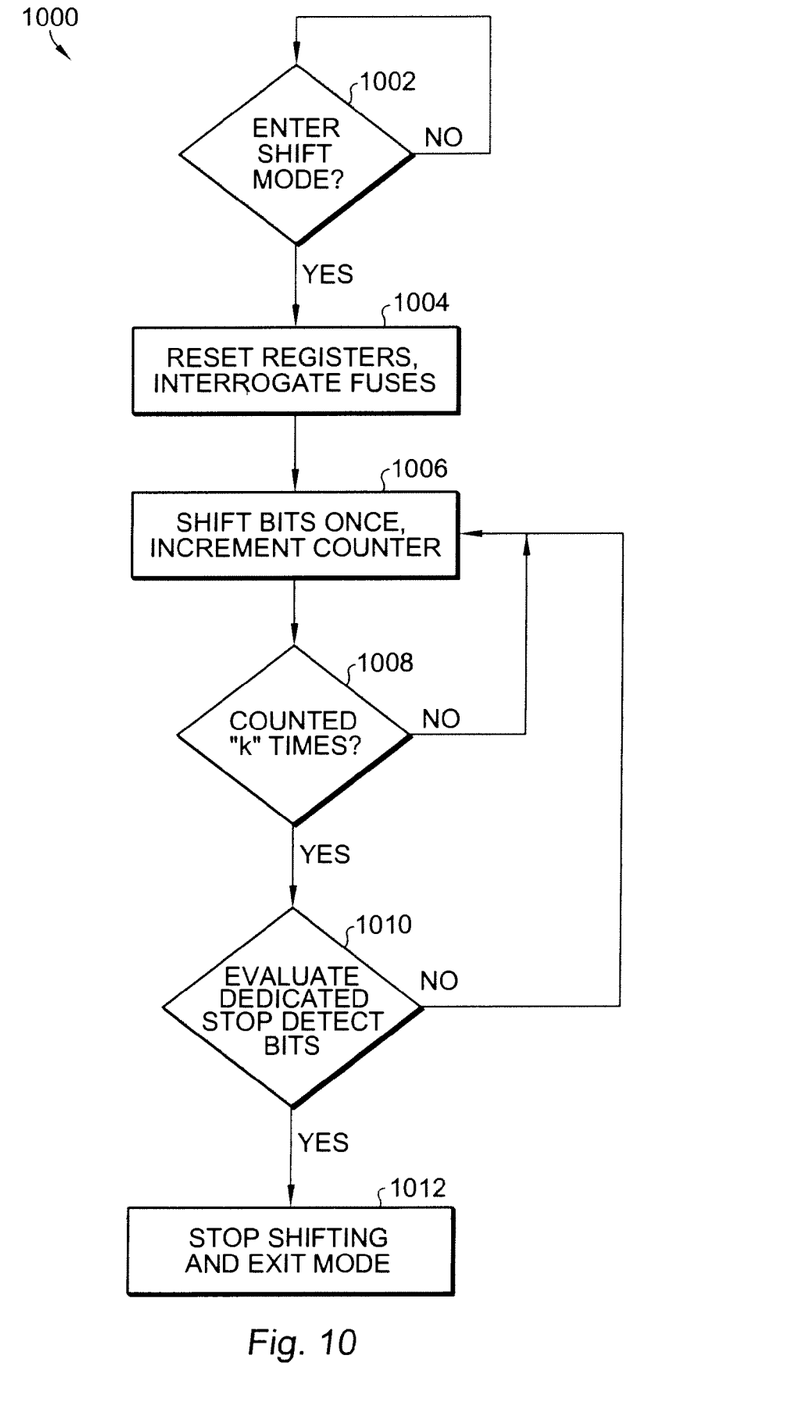
FIG. 10 is a state diagram of a counting method for a repair circuit according to the present invention.

Referring now to FIG. 10, a state diagram 1000 of a counting method for a repair circuit according to the present invention is shown. In the state diagram 1000, the counting method only counts to the number "k", relying on a code of information to determine when to stop shifting. The number "k" is a subset of the total number of items to be shifted, which is "n". The number "k" is equal to the number of bits that are "meaningful" to the logic that uses the shifted bits. A shifting example is described below and illustrated in FIG. 18.

At step 1002 the counting method enters the shift mode. If the shift mode is entered, all registers are reset and the fuses are interrogated at step 1004. At step 1006 the bits are shifted once, and a counter is incremented. At step 1008, the counting method determines whether or not "k" number of bits has been counted. If not, the method reverts to step 1006. If "k" number of bits has been counted, then the method of the present invention proceeds to step 1010 to evaluate the dedicated stop detect bits. If the answer is no (the code in the dedicated stop detect register does not match the pre-programmed stop condition) then the method reverts to step 1006. If the answer is yes (the code in the dedicated stop detect register does match the pre-programmed stop condition) then the method proceeds to step 1012 where shifting is stopped and the exit mode is entered.

Figure 11:
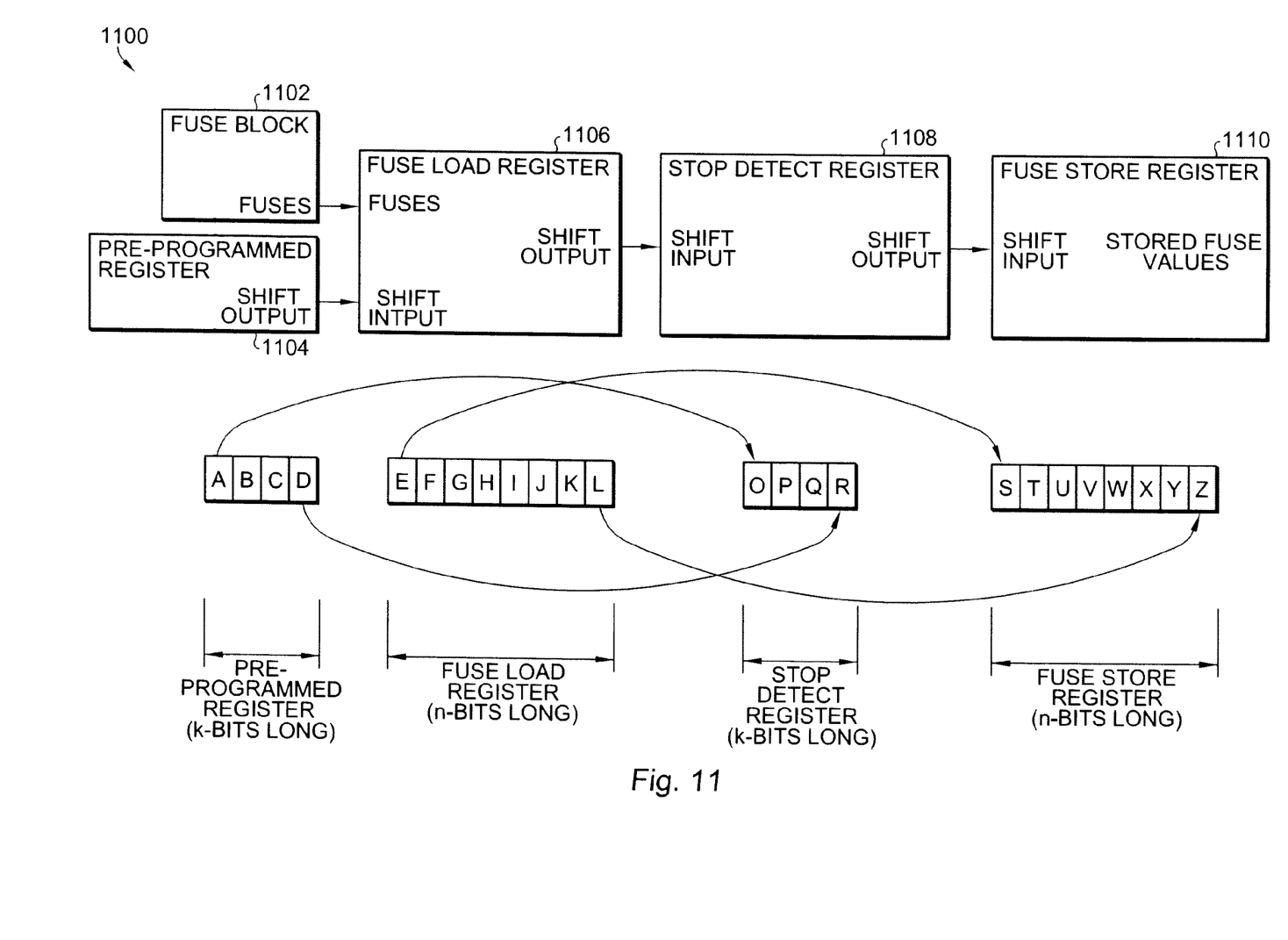
FIG. 11 is a simplified block diagram of a repair circuit according to the present invention.

A simplified block diagram of a repair circuit 1100 according to the present invention is shown in FIG. 11. In the simplified block diagram of FIG. 11, counting proceeds only to the number "k", relying on a code of information to determine when to stop shifting. Repair circuit 1100 includes a fuse block 1102, a pre-programmed register 1104, and a fuse load register 1106. The fuse output of fuse block 1102 is coupled to the corresponding fuse input of the fuse load register 1106. The shift output of pre-programmed register 1104 is coupled to the corresponding shift input of fuse load register 1106. The shift output of fuse load register 1106 is coupled to the corresponding shift input of a stop detect register 1108. The shift output of stop detect register 1108 is coupled to the corresponding shift input of fuse store register 1110, which includes the stored fuse values.

The letters A-L and O-Z are shown in FIG. 11 to illustrate the movement of the bits through the various registers, according to the counting method of the present invention. It should be noted that, as in the prior art, it still takes "n" shifts to move position "A" to "O", "D" to "R", "E" to "S", and "L" to "Z". Instead of just counting to "n" as in the prior art, an additional stop detect register 1108 of length "k" is used only for detecting a corresponding "stop code". The stop code indicates that position "E" has moved exactly to position "S", as well as the other bit transitions described above. A counter, described below, only needs to count up to "k" over and over again until the stop code is in position and the counter is at a particular count.

Figure 12:
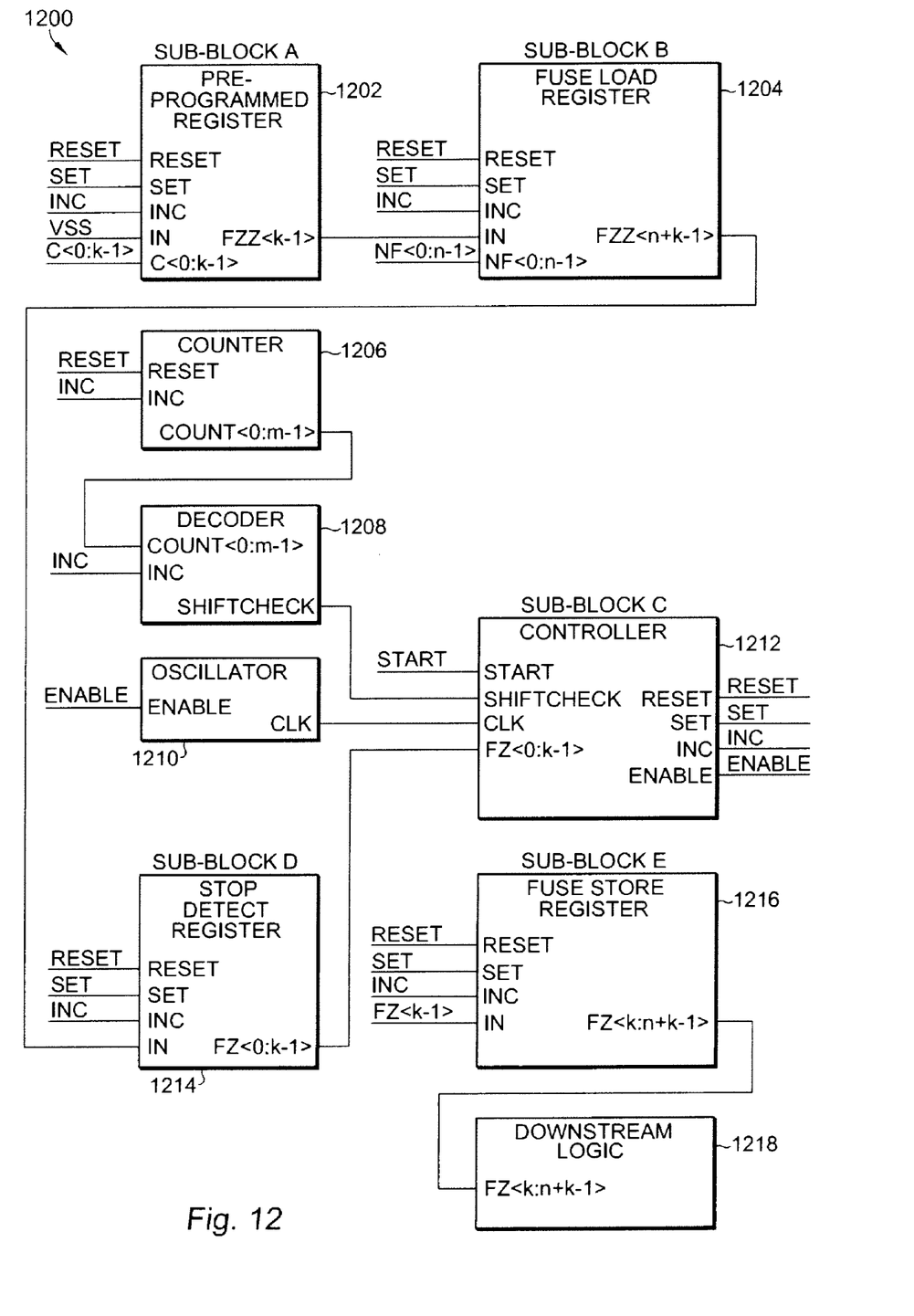
FIG. 12 is a detailed block diagram of a repair circuit according to the present invention.

Referring now to FIG. 12, a detailed block diagram of a repair circuit 1200 is shown according to the present invention. Again, the operation of the circuit shown in FIG. 12 operates according to the counting method of the present invention, wherein the count proceeds to the number "k", relying upon a code of information to determine when to stop shifting bits. In FIG. 12, circuit 1200 includes a pre-programmed register 1202, a fuse load register 1204, a counter 1206, a decoder 1208, an oscillator 1210, a controller 1212, a stop detect register 1214, a fuse store register 1216, and downstream logic 1218. Certain blocks are described in further detail below. Those blocks that are not further described can be implemented using conventional logic circuits that are known to those of ordinary skill in the art. The output (FZZ<k−1>) of pre-programmed register 1202 is coupled to the corresponding IN input of the fuse load register 1204. The output (FZZ<n+k−1>) of fuse load register 1204 is coupled to the corresponding IN input of the stop detect register 1214. The output (FZ<0:k−1>) of the stop detect register 1214 is coupled to the corresponding input (FZ<0:k−1>) of the controller 1212. The output (COUNT<0:m−1>) of the counter 1206 is coupled to the corresponding input (COUNT<0:m−1>) of the decoder 1208. The SHIFTCHECK output of the decoder 1208 is coupled to the SHIFTCHECK input of the controller 1212. The CLK output of the oscillator 1210 is coupled to the CLK input of the controller 1212. The controller 1212 provides four functions to control the shift chains. The first operation is the generation of a reset signal, which initializes all shift register positions to a known state. The second operation is the generation of a SET signal, which loads fuse information into the shift chain. These two signals are generated from the signal START. The third operation is the generation of an INC signal, which is used to increment a counter. This signal is derived from the CLK signal from the oscillator. The final function of the controller is to provide an ENABLE signal to the oscillator. The ENABLE signal is a '1' while shifting is ongoing, and is a '0' once the pre-programmed code reaches the stop detect position. Once ENABLE is low, the oscillator 1210 is disabled so the CLK signal no longer toggles, and shifting stops. The downstream logic uses the fuse information to determine whether or not to enable a redundant element and what address that element should replace. Fuse store register 1216 receives the FZ<k−1> bit at the IN input. The output (FZ<k:n+k−1>) of the fuse store register 1216 is coupled to the input (FZ<k:n+k−1>) of the downstream logic block 1218.

In operation, the only inputs to the circuit shown in FIG. 12 are START, C<0:k−1>, and NF<0:n−1>. The NF<0:n−1> bits are shifted into the corresponding store registers, FZ<k:n+k− 1>, respectively. This function is complete (meaning NF<0> has shifted all the way to position FZ<k>) when the counter is in SHIFTCHECK mode and the code bits (C<0:k−1>) have shifted all the way to position FZ<0:k−1>. The SHIFTCHECK state is enabled once every 'k' increments and lasts until another increment signal is given. Since the shift data is grouped into 'k' sized groups, the data is only potentially valid after the data in the shift chain has moved 'k' bit positions. By creating a signal that is only valid every 'k' shifts and using it to enable the interrogation of the dedicated stop detect register bits for the correct stop code, any number of groups of 'k' bits can be controlled using the same controller.

Figure 13:
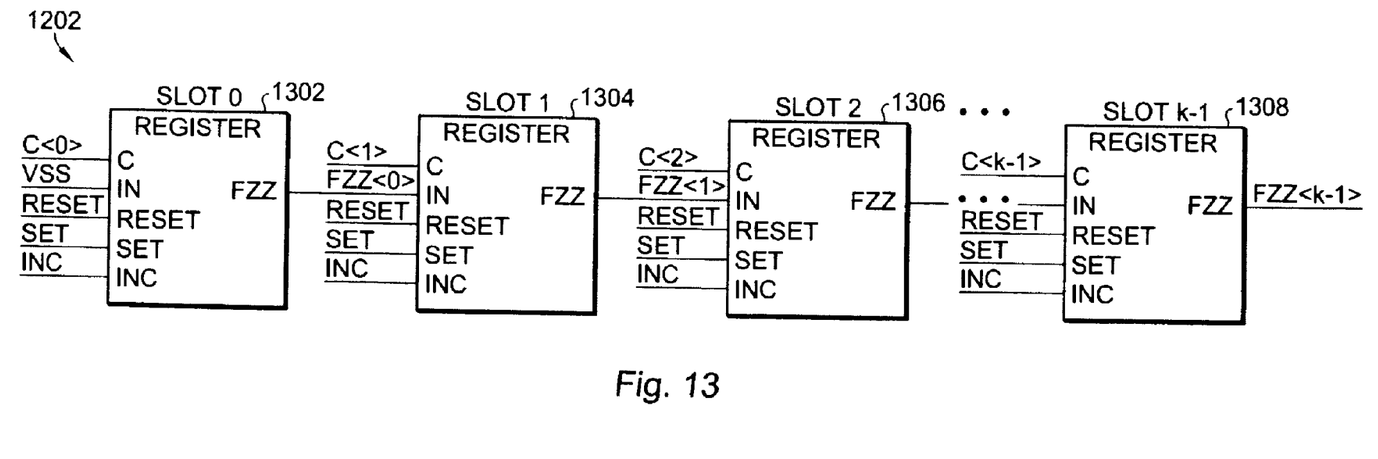
FIG. 13 is a sub-block diagram of a pre-programmed register from FIG. 12 according to the present invention.

Referring to FIG. 13, a sub-block diagram of a pre-programmed register 1202 from FIG. 12 is shown according to the present invention. Further detail of register 1202 reveals that it is comprised of serially-coupled registers 1302, 1304, 1306, and 1308 at the Slot 0, Slot 1, Slot 2, and Slot k−1 positions. The C<x> inputs of the registers are the pre-programmed stop code. That is, each C<x> input is hard-wired to either ground or to the power supply voltage to create a unique code (which is unusable in downstream logic).

Figure 14:
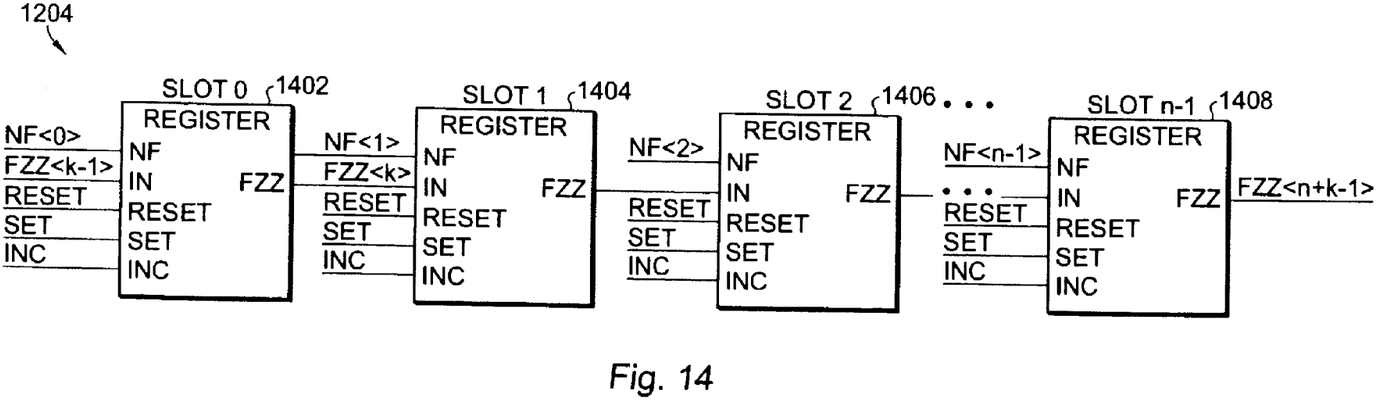
FIG. 14 is a sub-block diagram of a fuse load register from FIG. 12 according to the present invention.

Referring to FIG. 14, a sub-block diagram of a fuse load register 1204 from FIG. 12 is shown according to the present invention. Further detail of register 1204 reveals that it is comprised of serially-coupled registers 1402, 1404, 1406, and 1408 at the Slot 0, Slot 1, Slot 2, and Slot k−1 positions. NF<x> is the logical representation of the status of the corresponding physical fuse. Note that the IN connection in "Slot 0" is connected to the last output of the pre-programmed register (FZZ<k−1>), unlike in the prior art, which has this input tied to ground. The numbering of the FZZ nodes in the load register 1204 is offset by the number "k".

Figure 15:
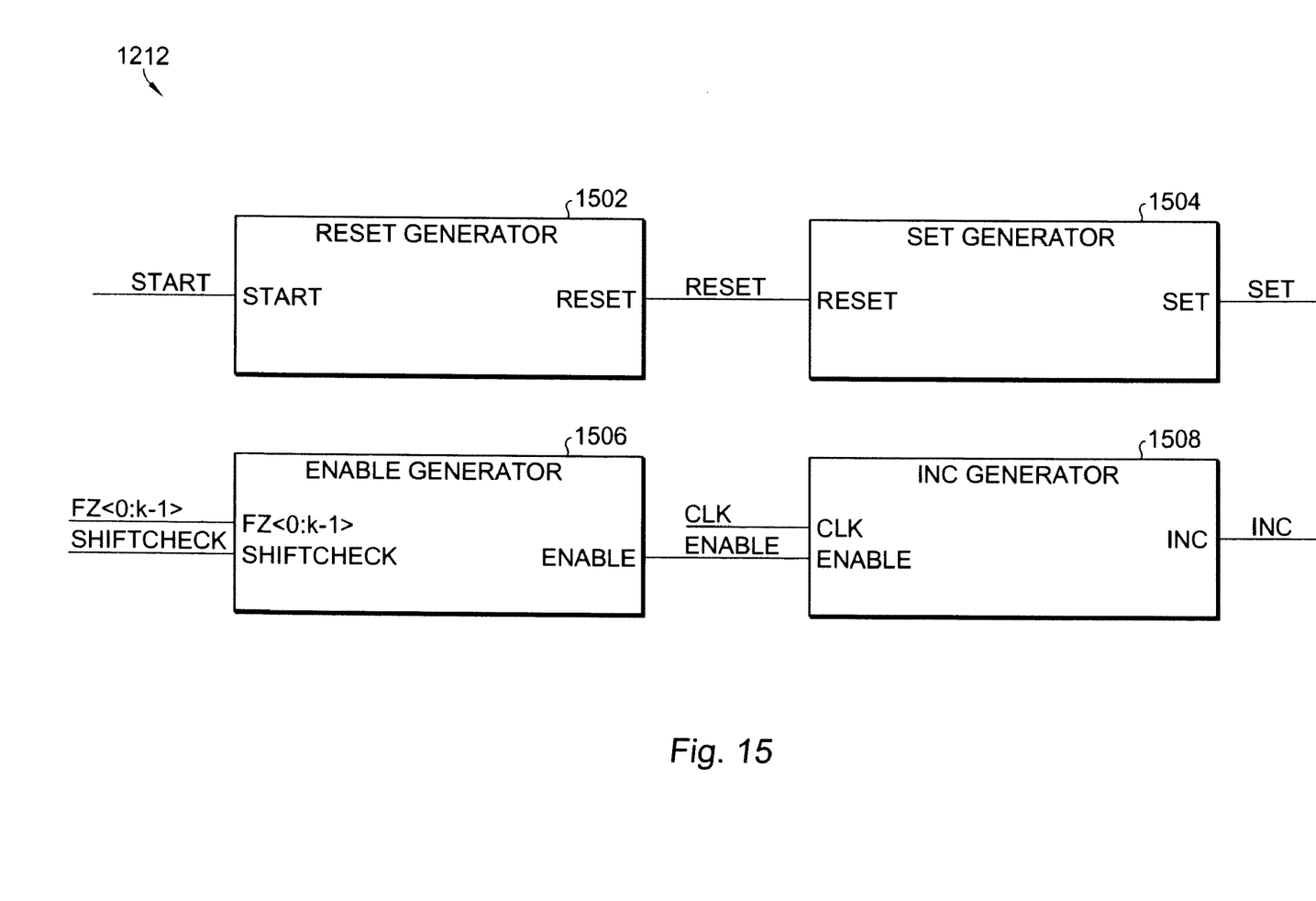
FIG. 15 is a sub-block diagram of a controller from FIG. 12 according to the present invention.

Referring to FIG. 15 a sub-block diagram of a controller 1212 from FIG. 12 is shown according to the present invention. Controller 1212 includes a reset generator 1502 having a reset output coupled to the reset input of a set generator 1504. Set generator 1504 provides the SET output. An enable generator 1506 receives the FZ<0:k−1> and SHIFTCHECK inputs and provides an ENABLE output. The increment generator 1508 receives the CLK and ENABLE inputs and provides an increment output.

In operation, the inputs to the controller 1212 are START, FZ<0:k−1>, SHIFTCHECK, and CLK. When START is asserted, a pulse called RESET is generated, which sets all the registers to zeroes. When RESET expires, it generates a pulse called SET, which is used to load in data to the fuse load register 1204 (i.e., read the fuses). The dedicated stop detect bits, FZ<0:k−1> are sent to the enable generator 1506 that compares the status of these stop detect bits to the pre-programmed stop code. This comparison only happens if the signal SHIFTCHECK is in the on state, to avoid premature termination of the shifting. The SHIFTCHECK signal is generated based on the counter bits, such that the SHIFTCHECK signal is only in the on state once every "k" shifts. So long as SHIFTCHECK is in the off state, or the values of FZ<0:k−1> do not match the pre-programmed stop code, the signal ENABLE remains in the on state. If SHIFTCHECK is on and FZ<0:k−1> matches the stop code, then ENABLE turns off. The increment generator 1508 uses the CLK output of the oscillator 1210 and the status of ENABLE to generate the INC signal, which provides the means for shifting all of the bits and incrementing the counter 1206. If ENABLE is on, then INC is equal to CLK. If ENABLE is off, then INC is off. Since there are no more transitions on INC, the bits in the shift chain are unable to move and the counter 1206 is not able to increment, thus providing the automatic stop function according to the present invention.

Figure 16:
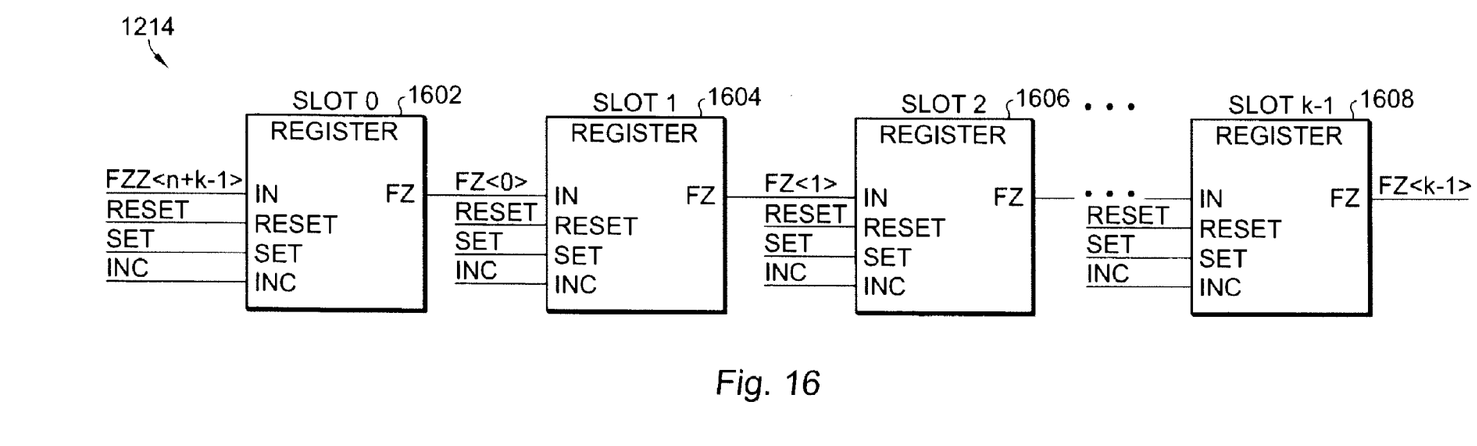
FIG. 16 is a sub-block diagram of a stop detect register from FIG. 12 according to the present invention.

Referring to FIG. 16, a sub-block diagram of a stop detect register 1214 from FIG. 12 is shown according to the present invention. Further detail of register 1214 reveals that it is comprised of serially-coupled registers 1602, 1604, 1606, and 1608 at the Slot 0, Slot 1, Slot 2, and Slot k−1 positions. The IN connection at "Slot 0" is connected to the last output of the fuse load register 1204. Each FZ<0:k−1> bit is sent to the controller 1212 to be compared against the pre-programmed stop code. The FZ<k−1> signal is also sent to the fuse store register 1216 so that all the other information can reach its correct storage location.

Figure 17:
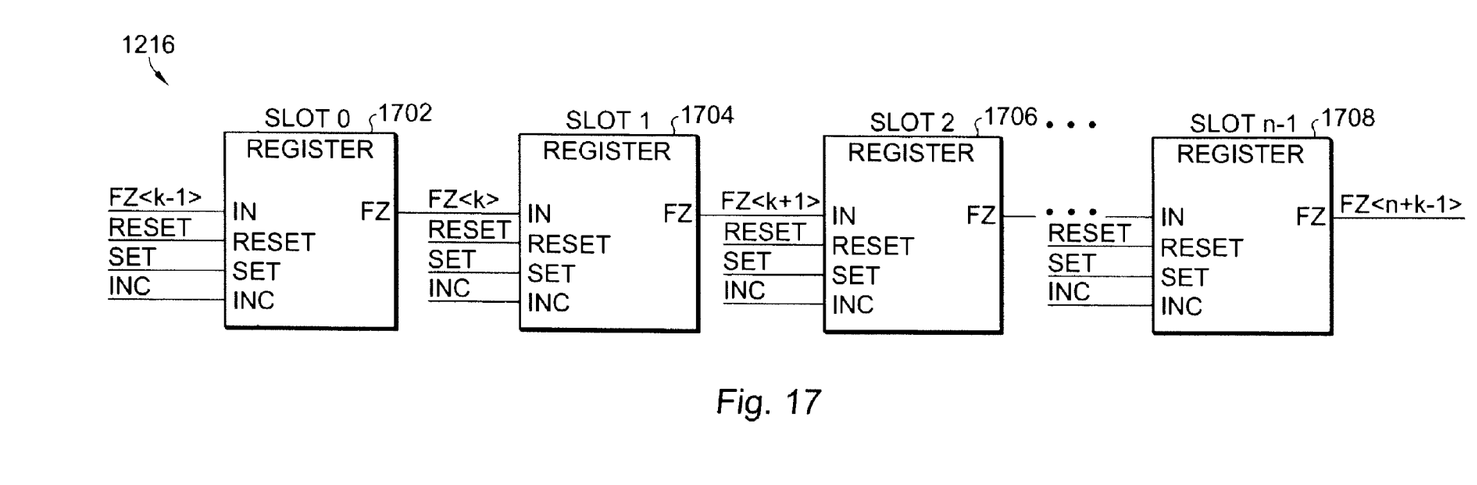
FIG. 17 is a sub-block diagram of a fuse store register from FIG. 12 according to the present invention.

Referring to FIG. 17, a sub-block diagram of a fuse store register 1216 from FIG. 12 is shown according to the present invention. Further detail of register 1216 reveals that it is comprised of serially-coupled registers 1702, 1704, 1706, and 1708 at the Slot 0, Slot 1, Slot 2, and Slot k−1 positions. Note that the IN connection in "Slot 0" is connected to the last output of the stop detect register 1214 (FZ<k−1>). Each position FZ<k:n+k−1> corresponds to a fuse from the group NF<0:n−1>, where FZ<k> maps to NF<0> and FZ<n+k−1> maps to NF<n−1>. FZ<k:n+k−1> is used in the downstream logic.

Figure 18:
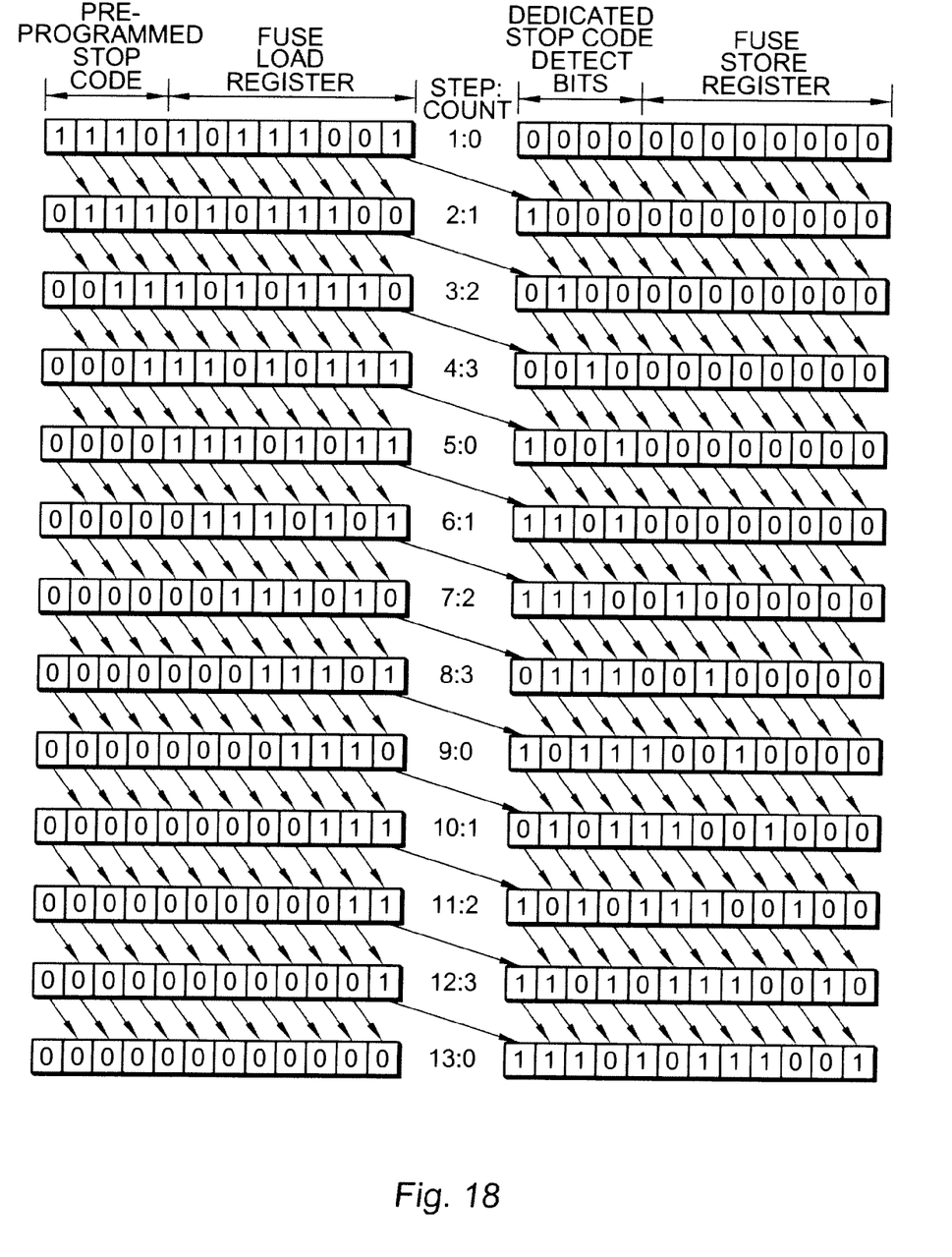
FIG. 18 is a diagram of a shifting example according to the present invention.

FIG. 18 is a diagram of a shifting example according to the present invention, wherein k=4, n=8, the stop condition code is equal to 1110, and count=0. In FIG. 18, the shift chain has already been reset (to all zeroes) and the fuse load register has read the values of the fuses and the counter is initialized to '0' at step 1. The SHIFTCHECK mode is valid every time the counter value is a '0', so at step 1 the dedicated stop detect bits are interrogated, but they do not match the stop code. This condition results in four shifts, to step 5. Again, the counter has reached SHIFTCHECK mode, but the code in the stop detect register still does not match the stop code, resulting in four more shifts to step 9. Step 9 results in the same condition as step 5, so four more shifts occur to step 13. At step 13, the counter is in SHIFTCHECK mode and the stop detect register contains the stop code. At this point, the enable signal to the oscillator is turned off, thus shifting ceases since all bits are in position.

Having described and illustrated the principle of the invention in a preferred embodiment thereof, it is appreciated by those having skill in the art that the invention can be modified in arrangement and detail without departing from such principles. Although a preferred method and circuit has been shown, the exact details of the preferred method and circuit can be changed as desired as required for a particular application. We therefore claim all modifications and variations coming within the spirit and scope of the following claims.

I claim:

1. A self-controlled shift register circuit comprising N number of bits to be shifted, which are controlled by the state of an M-bit counter, wherein M is independent of the number N, wherein a set number of bits K is used to detect a condition for termination of the shifting of the N number of bits.

2. The self-controlled shift register circuit of claim 1 wherein the length of the entire self-controlled shift register comprises N+K.

3. The self-controlled shift register circuit of claim 1 wherein shifting begins each time a single input signal pulses.

4. The self-controlled shift register circuit of claim 1 wherein no shifting occurs until a single input signal pulses.

5. A self-controlled shift register circuit comprising N number of bits to be shifted, which are controlled by the state of an M-bit counter, wherein M is independent of the number N, and further comprising a hard-programmed code of K bits that is shifted through the register.

6. The self-controlled shift register circuit of claim 5 wherein the hard-programmed code of K bits comprises an invalid code.

7. The self-controlled shift register circuit of claim 5 wherein shifting begins each time a single input signal pulses.

8. The self-controlled shift register circuit of claim 5 wherein no shifting occurs until a single input signal pulses.

* * * * *